United States Patent [19]

McKinlay

[11] 4,138,615
[45] Feb. 6, 1979

[54] PRESETTABLE INTEGRATING TIMING CIRCUIT

[75] Inventor: James R. McKinlay, Los Angeles, Calif.

[73] Assignee: The United States of America as represented by the Secretary of the Navy, Washington, D.C.

[21] Appl. No.: 830,721

[22] Filed: Sep. 6, 1977

[51] Int. Cl.$^2$ .................... H03K 5/153; H03K 13/02
[52] U.S. Cl. .................................. 307/293; 328/127;
307/230; 307/362; 307/300; 307/315
[58] Field of Search ............... 307/280, 293, 300, 315, 307/230, 229, 362; 328/127

[56] References Cited

U.S. PATENT DOCUMENTS

| | | | |
|---|---|---|---|
| 3,772,533 | 11/1973 | Bruckner et al. | 307/229 X |
| 3,836,791 | 9/1974 | Galloway | 307/293 |
| 3,942,036 | 3/1976 | Burckhardt et al. | 307/229 |
| 4,016,496 | 4/1977 | Eastcott | 328/127 X |

Primary Examiner—John S. Heyman
Attorney, Agent, or Firm—Richard S. Sciascia; Ervin F. Johnston; John Stan

[57] ABSTRACT

A presettable integrating timing circuit is capable of comparing the time-volt product of an input signal with a preset signal. Means, comprising an input and an output, integrate an electrical signal at the input into an integrated signal at the output. Means, having two inputs, one input being connected to the output of the integrating means, the other input being connectable to a reference voltage, are capable of comparing the magnitude of a signal appearing at the first-named input with the reference voltage. Means are connected to the integrating means for clamping the input of the integrating means at a desired value. A feedback circuit is connected between the output and the input of the integrating means, to prevent the integrating means from saturating.

3 Claims, 5 Drawing Figures

PRESETTABLE SINGLE INPUT SIGNAL TIMER.

NOTE:
* = 1%, 1/8 W.
E INDICATES JUNCTION POINT
DIODES IN4153 UNLESS OTHERWISE SPEC.

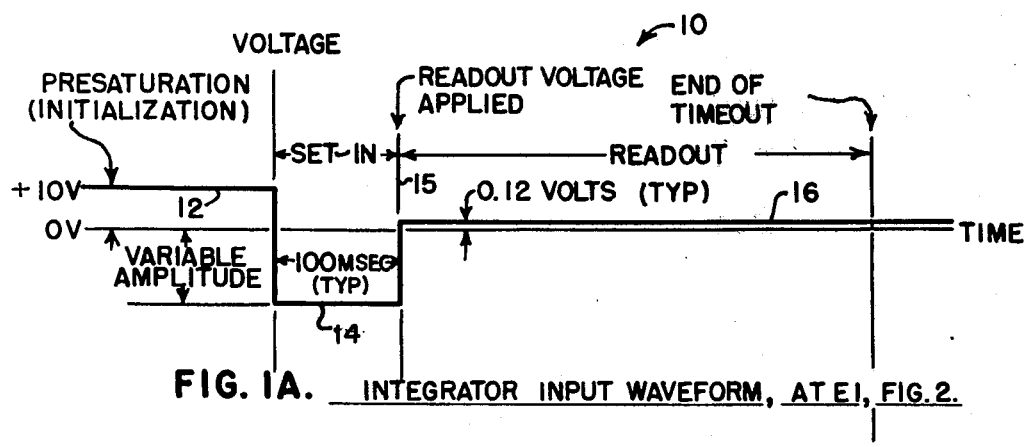
FIG. 1A. INTEGRATOR INPUT WAVEFORM, AT E1, FIG. 2.
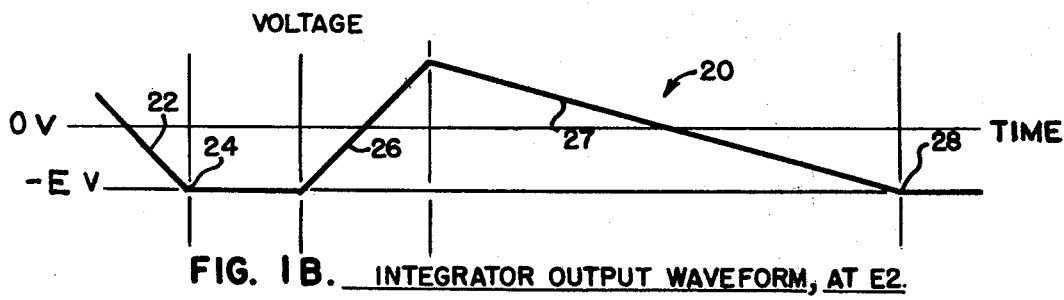
FIG. 1B. INTEGRATOR OUTPUT WAVEFORM, AT E2.
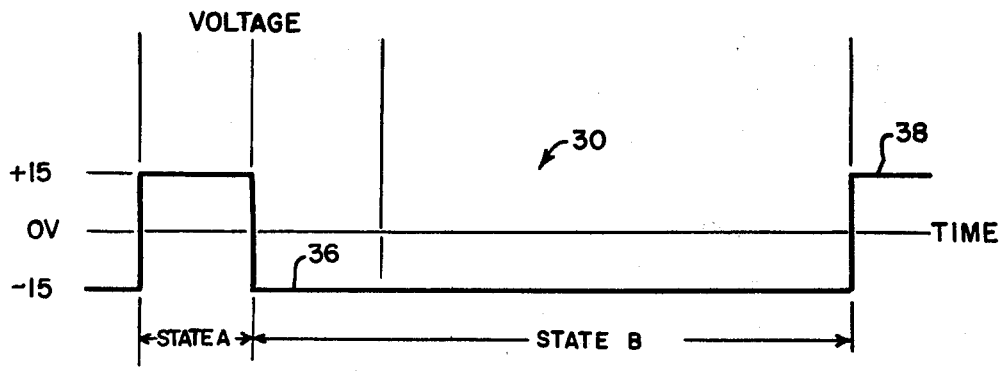
FIG. 1C. COMPARATOR OUTPUT WAVEFORM, AT E7.
FIG. 1. TIMING CIRCUIT WAVEFORMS.

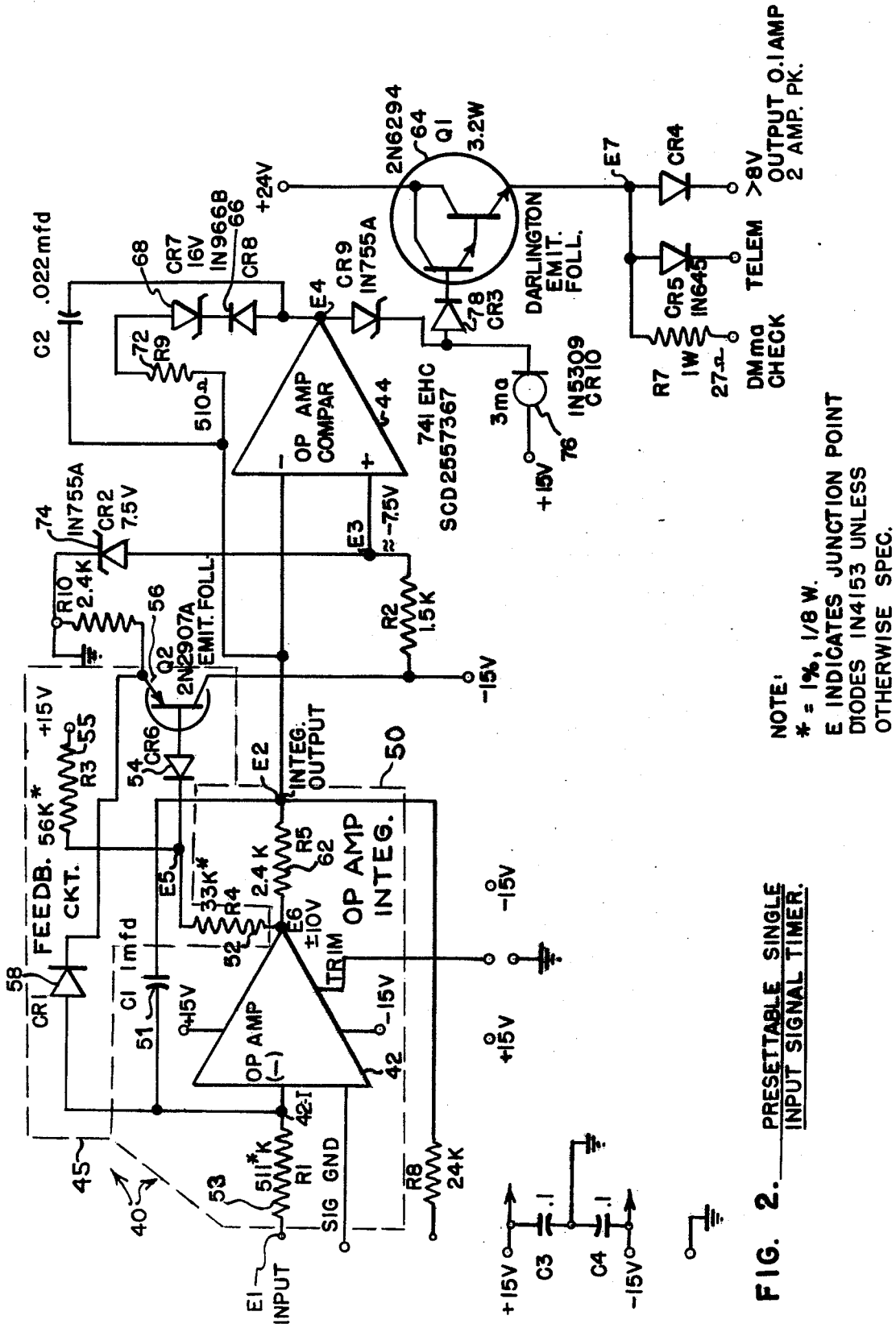
FIG. 2. PRESETTABLE SINGLE INPUT SIGNAL TIMER.

PRESETTABLE INTEGRATING TIMING CIRCUIT

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

In general terms, this invention relates to timing circuitry which is able to accomplish analog integration as well as timing functions in any electronic system requiring highly accurate integrating and timing circuits.

More specifically, this invention relates to electronic timing circuitry which can be preset to some desired voltage-time integral, and which can in turn integrate a voltage proportional to a measured system parameter, such as velocity, and provide an output signal when the time integral of the parameter voltage is equivalent to the preset voltage-time integral.

The timing circuit integrates an input signal with respect to time, in an operational amplifier integrator, and when the integral, or time-volt product, is equal to a previously set-in (preset) product the output changes state. It can be used, for example, with an input voltage representing velocity to indicate when a certain preset distance has been covered; or with an acceleration to indicate when a desired velocity has been reached. The timing circuit is designed to give the greatest possible accuracy in the comparison of the integral of the preset and input signals. These two signals are both input on the same line, which makes the comparison independent of the input scaling resistor. The presaturation signal also utilizes the same input. A presaturation signal is sometimes called an initialization signal. Although the circuit operates in three modes, no actual switching is required within the circuit. As is shown in FIG. 1A, the three modes are (1) initialization or presaturation; (2) set-in; and (3) readout. This feature plus the method of very accurately clamping the integrator output, both in the plus and in the minus directions, makes this circuit unique.

A circuit to accomplish the same task has been developed in the prior art. It is described in U.S. Pat. No. 3,836,791, to Glenn L. Galloway, entitled *PRESETTABLE SINGLE-INPUT VOLTAGE-TIME INTEGRATOR*, which issued on Sept. 17, 1974. The timer described therein had the disadvantage that several of the component values and offsets in the circuit could affect its accuracy, whereas in this invention only changes in component values and offsets between preset and time out can affect accuracy. An offset voltage may be defined as "the difference in voltage at the two inputs of an operational amplifier required to bring the output voltage to zero". Other offset parameters can be defined in a similar manner.

SUMMARY OF THE INVENTION

The timing circuit basically consists of an operational amplifier integrator, comprising an operational amplifier in parallel with a feedback capacitor, followed by a comparator operational amplifier, to detect the reference level of the integrator output. There is also a clamping circuit to reset the integrator. The integrator is conventional with two major differences: There is a resistor in series with the output to allow the output side of the feedback capacitor to be clamped at a desired level and there is a feedback circuit which prevents the amplifier from saturating in the negative output direction. This latter prevents the input summing junction from being driven away from zero by the input signal, thereby adding a spurious charge to the feedback capacitor. The comparator provides a feedback current to clamp the integrator output and provides the two-level output of the entire timing circuit.

OBJECTS OF THE INVENTION

An object of the invention is the provision of a timing circuit which can perform an integrating and a timing function.

Another object of the invention is the provision of timing circuit which can perform an integrating and timing function from a single input waveform.

Yet another object of the invention is the provision of a timing circuit which does not have the offset problems of prior art timing circuits.

Other objects, advantages and novel features of the invention will become apparent from the following detailed description of the invention, when considered in conjunction with the accompanying drawings, wherein:

BRIEF DESCRIPTION OF THE DRAWINGS

FIG. 1 is a set of three graphs, FIGS. 1A, 1B, and 1C, showing typical timing circuit waveforms at the input and output of the integrator and at the output of the comparator, respectively.

FIG. 2 is a schematic diagram of the timing circuit of this invention.

DESCRIPTION OF THE PREFERRED EMBODIMENTS

Referring now to FIG. 1, therein are shown typical waveforms of the timing circuit 40, shown in FIG. 2.

A presaturization of initialization signal, 12 of FIG. 1A, is applied to the input of the timer 40, at junction E1. This prepares the integrator 50 for taking the volt-time integral of the negative preset signal 14. This results in an integrator 50 output waveform 26, at E2, which has a positive slope. The volt-time product of the set-in signal 14 determines the height of curve 26.

At time 15, a readout voltage is applied. This signal can be 0 initially if a delay is required before the signal to be integrated starts. This causes the integrator output waveform 27, at junction E2, to have a negative slope. The absolute value of curve 27 at any instant is the integral of curve 14 minus the integral of curve 16 up to that instant plus a constant depending on reference level from which curve 27 is measured. The volt-time product of curve 16 in FIG. 1A is equal to the time-volt product of curve 14 in FIG. 1A.

Timing is accomplished by initially applying a positive presaturation voltage, shown as 12 in FIG. 1A, and applied at input E1 of FIG. 2. As is shown at 22 of FIG. 1B, this drives the output of the integrator circuit 42 at E2 in the negative direction until initialization occurs, at time 24. A negative pulse, 14 in FIG. 1A, of fixed width (100 ms, typical) and variable amplitude is then applied, to set in the desired time value (since the pulse width is fixed, time is directly proportional to amplitude). After set-in has occurred, a fixed or variable amplitude (typically 0.12 volt) readout voltage, 16 in FIG. 1A, is applied to the circuit 40 in FIG. 1. When the output, 20 in FIG. 1B, of the integrator circuit 42 reaches the preset output, −E, at 28, the comparator 44 again switches, providing the switching signal output, in FIG. 1C, that indicates the end of the timing interval.

It should be pointed out that the set-in pulse, 14 in FIG. 1A, does not necessarily have to be of a fixed width and variable amplitude. The set-in pulse may also be controlled by having a fixed amplitude and variable width. It is the volt-time product which is significant. Curve 14 need not even be a horizontal line. Curve 16 also may be of any shape just so that it does not drive the op amp output into (=) saturation.

Referring now to FIG. 2, therein is shown a presettable integrating timing circuit 40, capable of comparing the time-volt product of an input signal, 16 in FIG. 1, with a preset signal 14. The timer 40 includes means 42, comprising an input, at E1, and an output, at E2, for integrating an electrical signal at the input into an integrated signal at the output. In the timing circuit 40, the means for integrating 50 is an operational amplifier (op amp) integrator, comprising operational amplifier 42, capacitor 51, and resistors 53 and 62.

The means 44 has two inputs, at junctions E2 and E3, one input, at E2, being connected to the output of the integrating means 50, the other input, at E3, being connectable to a reference voltage, −7.5V in this case, as shown. The means 44 is capable of comparing the magnitude of a signal appearing at input junction E2 with the reference voltage appearing at junction E3. In the timing circuit 40 the means 44 for comparing comprises an operational amplifier (op amp) comparator.

Means 45 are connected to the integrating means 44 for clamping the output E6 of the integrating means 42 at a desired value, −E volts. The means 45 comprises a feedback circuit, connected between the output at E6, and the input 42I of the integrating means 42, to prevent the integrating means from saturating. The feedback circuit comprises a series combination, connected between the output, at E6, and the input 42-I of the op amp integrator 50, comprising a resistor 52, a diode 54, an emitter follower 56 and another diode 58. Resistor 55 is also part of means 45.

A general description of the circuit follows, more or less as described in the "Summary of the Invention", but with more specificity with respect to circuit elements.

The timer circuit 40 basically consists of an op amp integrator 42, followed by a comparator op amp 44, to detect the reference level of the integrator output, at E2. There are also clamping circuits to reset the integrator 42. The integrator 42 is more or less conventional with two exceptions: There is a resistor 62 in series with the output, at junction E6, to allow the output side, at junction E2, of the feedback capacitor 15C to be clamped at a desired level; and there is a feedback circuit to prevent the amplifier 42 from saturating in the negative output direction. The feedback circuit comprises resistor 52, diode 54, emitter follower 56 and diode 58. The feedback circuit prevents the input summing junction 42-I from being driven away from zero by the input signal, 10 of FIG. 1A, thereby adding a spurious charge to capacitor 15C. The comparator circuit 44 drives the output power Darlington transistor 64, and provides a feedback current to clamp the integrator 42 output at E2.

Circuit operation will now be described based on its normal operating sequence. With the +10 volt presaturation signal, 12 of FIG. 1, on the input at E1, the operational amplifier 42 output is driven negative until junction E5 is 3 diode drops (voltage drops) below ground.

A "diode drop" is fixed voltage drop across a diode when it is forward biased. At this time E6 will be somewhat more negative than −E (FIG. 1B, 24) due to the driver, $R_3$, $R_4$ to +15V, but not negative enough to saturate the op amp 42. In the timing circuit 40, the three devices in series, only two being diodes, are diode 54, the base-to-emitter junction of emitter follower 56, and diode 58, With junction E5 negative to the required value, diode 54 then conducts, driving the base of emitter follower 56 and causing its emitter to go negative. Diode 58 then conducts, creating a low impedance (compared to the input resistor 53) feedback path, which clamps the output at E2.

The integrator output at E2 will tend to follow the amplifier 42 output at E6, but when the comparator 44 threshold voltage is reached, its output at E4 supplies a current through diodes 66 and 68 and resistor 72, to hold the junction point E2 at the comparator reference level, at junction E3, established by zener 74. With the comparator 44 feedback loop closed, there can be no appreciable difference in voltage between the two inputs, E2 and E3, of the amplifier 44. The comparator 44 output at E4 also drives the Darlington emitter follower 64 to produce a high output. The constant current diode 76 pulls the Darlington base more positive than the amplifier 44 output could, to give at least 8 volts, circuit output at junction E7, under 2 amps load as shown in FIG. 2.

When the negative preset signal, 14 in FIG. 1A, is applied to the input, junction E1, the integrator output, junction point E2, is driven positive, 26 in FIG. 1B. This drives the comparator 44 output at E4 negative, (36 in FIG. 1C) and allows the Darlington 64 base, and thus the output, at junction E7, to go to zero. Diode 78 protects the Darlington 64 base from excessive negative voltage. When the 0.12 volt signal, 16 in FIG. 1A, is applied to the input at E1, the integrator 42 output at E2 has a negative slope. When it reaches the same output voltage 28 in FIG. 2B as in the presaturation state, point 24, −E; it triggers the comparator 44 and the output at E7 goes high, reference numeral 38 in FIG. 1C, ending the time cycle.

Obviously, many modifications and variations of the present invention are possible in the light of the above teachings, and, it is therefore understood that the invention may be practiced otherwise than as specifically described.

What is claimed is:

1. A presettable integrating timer, capable of comparing the time-volt product of an input with a preset signal, comprising:
    means, comprising an input and an output, for integrating an electrical signal at the input into an integrated signal at the output, the means for integrating being an operational amplifier (op amp) integrator;
    means, having two inputs, one input being connected to the output of the integrating means, the other input being connectable to a reference voltage, the means being capable of comparing the magnitude of a signal appearing at the first named input with the reference voltage, the means for comparing comprising an operational amplifier (op amp) comparator;
    means, connected to the integrating means, for clamping the input of the integrating means at a desired value; and a feedback circuit, connected between the output and the input of the integrating means to prevent the integrating means from saturating, the feedback circuit comprising a series combination, connected between the output and the input of the operational amplifier integrator, comprising a resistor, a diode, an emitter follower, another diode, and another resistor.

2. The timer according to claim 1, further comprising:
means, whose input is connected to the output of the operational amplifier comparator, for increasing the power output of the comparator.

3. The timer according to claim 2, wherein:
the means for increasing the power output is a Darlington emitter follower.

* * * * *